(12) United States Patent
Kitagawa

(10) Patent No.: US 6,326,106 B1
(45) Date of Patent: Dec. 4, 2001

(54) OVERLAY MEASURING PATTERN, AND PHOTOMASK

(75) Inventor: Tetsuya Kitagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/265,858

(22) Filed: Mar. 11, 1999

(30) Foreign Application Priority Data

Mar. 13, 1998 (JP) .................................. 10-082826

(51) Int. Cl.[7] .................................. G03F 9/00
(52) U.S. Cl. .................................. 430/5
(58) Field of Search .................. 430/5, 22; 438/462, 438/975; 257/797

(56) References Cited

U.S. PATENT DOCUMENTS

| | | | |
|---|---|---|---|
| 5,643,698 | * 7/1997 | Okamoto | 430/5 |
| 5,733,690 | * 3/1998 | Jeong et al. | 430/5 |
| 5,856,053 | * 1/1999 | Watanabe | 430/22 |
| 5,877,861 | * 3/1999 | Ausschnitt et al. | 356/401 |
| 5,908,719 | * 6/1999 | Guckel et al. | 430/5 |

* cited by examiner

Primary Examiner—Mark F. Huff
Assistant Examiner—Saleha R. Mohamedulla
(74) Attorney, Agent, or Firm—Ronald P. Kananen

(57) ABSTRACT

An overlay measuring pattern has a rectangular portion and band-shaped portions separated from opposite sides of the rectangular portion by an equal distance and parallel to the sides. Even when a photoresist shrinks upon heating after the overlay measuring pattern is transferred to the photoresist, the taper amounts of the sides of the rectangular portion transferred to the photoresist equal each other in their sections between opposite sides. Hence, the overlay shift can be accurately obtained.

2 Claims, 8 Drawing Sheets

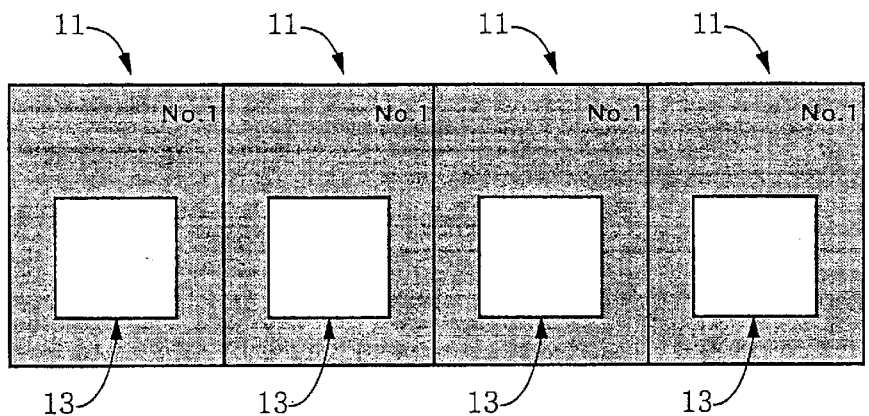
RELATED ART
FIG.2
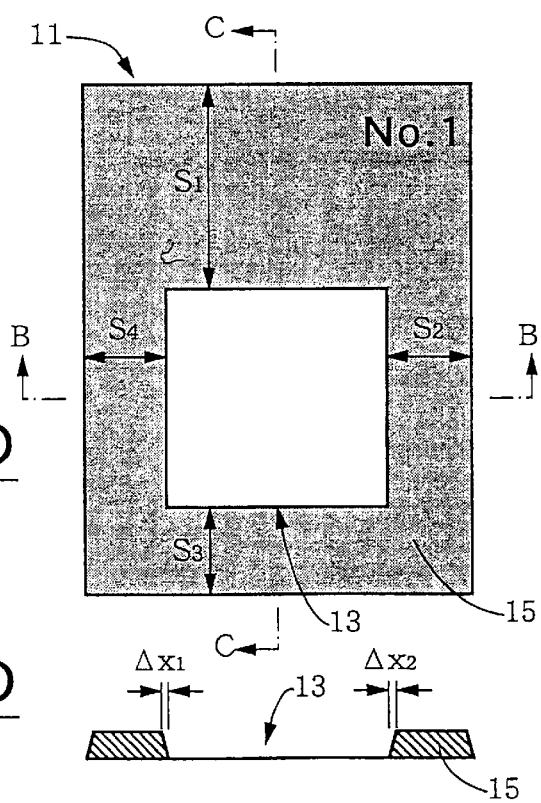
RELATED ART
FIG.3A
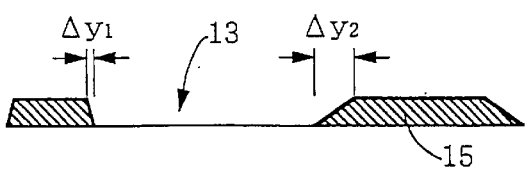
RELATED ART
FIG.3B
RELATED ART
FIG.3C

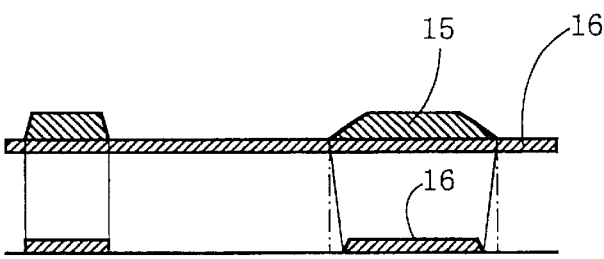
RELATED ART FIG.5A
RELATED ART FIG.5B
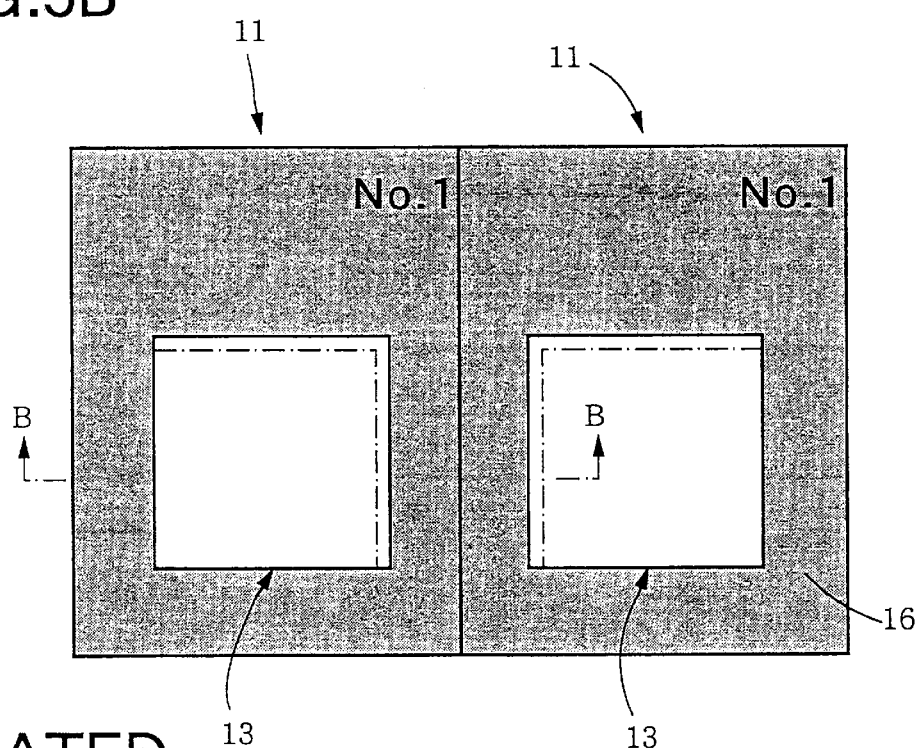
RELATED ART FIG.5C

RELATED
ART
FIG.6A
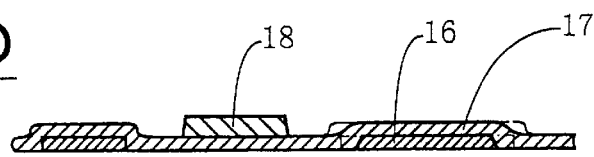
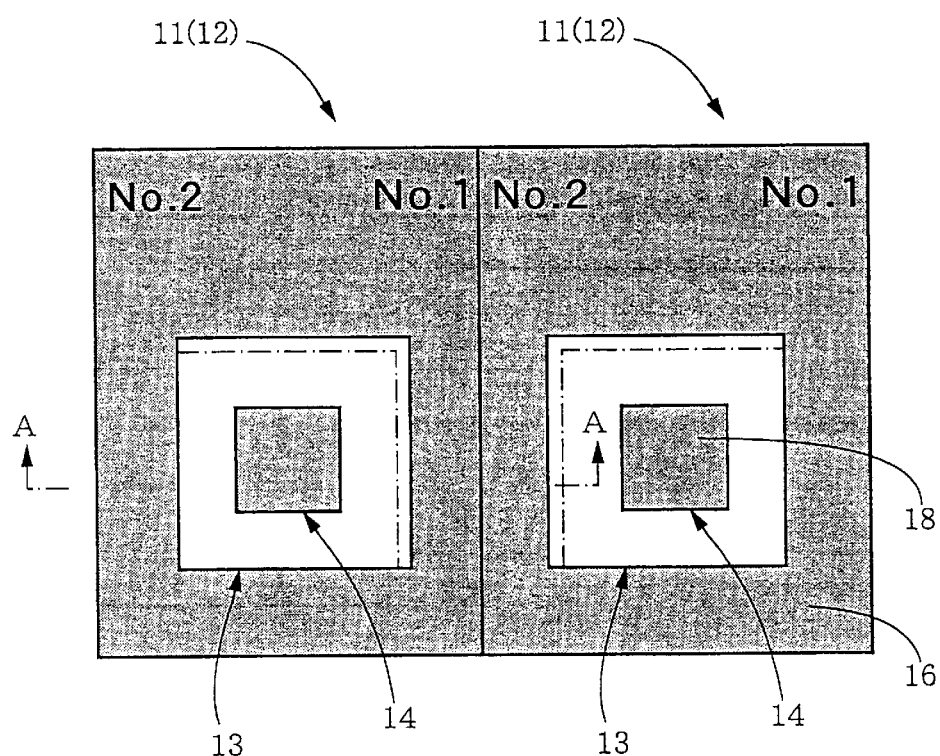
RELATED
ART
FIG.6B

OVERLAY MEASURING PATTERN, AND PHOTOMASK

BACKGROUND OF THE INVENTION

1. Field of the Invention

The present invention relates to measurement of overlay between the patterns of lower and upper layers in manufacturing a semiconductor device.

2. Description of the Related Art

In manufacturing a semiconductor device, processes of forming a film to be etched, forming a photoresist, transferring a pattern from a photomask to the photoresist by photolithography, transferring the pattern from the photoresist to the film to be etched by etching, and removing the photoresist are repeated a plurality of number of times to form a circuit pattern having a plurality of layers or the like. Hence, an overlay shift between the photomasks is an important factor in determining the degree of integration of the semiconductor device.

To cope with this overlay shift, an overlay measuring pattern is formed in, e.g., a scribing region of a photomask, where neither circuit pattern nor the like necessary for the manufacture of a semiconductor device is formed, and the overlay measuring pattern is measured by an overlay measuring apparatus of an optical pattern edge detection scheme, thereby measuring the overlay accuracy between the photomasks.

FIGS. 1A and 1B show a popular related art of an overlay measuring pattern which is called a box pattern. As shown in FIG. 1A, this related art comprises an overlay measuring pattern 11 called a main scale and an overlay measuring pattern 12 called a sub scale. The overlay measuring patterns 11 and 12 are formed on photomasks for forming the patterns of lower and upper layers, respectively.

The overlay measuring pattern 11 has a rectangular portion 13 as an opening in the pattern formed from chromium or the like. The overlay measuring pattern 12 has a rectangular portion 14 as a pattern formed from chromium or the like. The overlay measuring patterns 11 and 12 have characters such as "No. 1" and "No. 2" to identify the target transfer films on which the patterns are transferred, as shown in FIG. 1A. These characters are also transferred upon transferring the patterns.

The definitions of main and sub scales are relative. The overlay measuring pattern 11 may be used as the sub scale, and the overlay measuring pattern 12 may be used as the main scale. The rectangular portion 13 may be a pattern formed from chromium or the like, and the rectangular portion 14 may be an opening in the pattern formed from chromium or the like. Alternatively, both of the rectangular portions 13 and 14 may be patterns formed from chromium or the like, or both of the rectangular portions 13 and 14 may be openings.

The overlay measuring patterns 11 and 12 are formed on the photomasks such that the centers of the rectangular portions 13 and 14 match when the photomasks are accurately overlaid, as shown in FIG. 1B. Hence, when the overlay measuring patterns 11 and 12 are overlaid, the difference between a distance $x_1$ from a left side $X_1$ of the rectangular portion 13 to the left side $X_1$ of the rectangular portion 14 and a distance $x_2$ from a right side $X_2$ of the rectangular portion 13 to the right side $X_2$ of the rectangular portion 14, $(x_1-x_2)/2$, represents the overlay shift in the X direction, i.e., in the horizontal direction.

Similarly, when the overlay measuring patterns 11 and 12 are overlaid, the difference between a distance $y_1$ from a lower side $Y_1$ of the rectangular portion 13 to the lower side $Y_1$ of the rectangular portion 14 and a distance $y_2$ from an upper side $Y_2$ of the rectangular portion 13 to the upper side $Y_2$ of the rectangular portion 14, $(y_1-y_2)/2$, represents the overlay shift in the Y direction, i.e., in the vertical direction.

When patterns are to be transferred to three or more target transfer films, two or more overlay measuring patterns 11 as main scales are consecutively formed on the target transfer film as the first layer, as shown in FIG. 2. Sub scales corresponding to the second and subsequent layers are overlaid on the respective overlay measuring patterns 11. Using the overlay measuring pattern 11 transferred to the target transfer film as the first layer as a reference, the overlay accuracy of the photomasks of the second and subsequent layers is measured.

A photoresist is exposed and developed, and then, heated to a temperature within the range of about 90° C. to 150° C. by a hot plate or oven for drying and hardening. The upper portion of the photoresist defining the opening end largely thermally shrinks due to surface tension, so the photoresist has a tapered sectional shape. Since the taper amount depends on the volume of a photoresist, the taper amount of a photoresist applied to the same thickness is proportional to its area.

As shown in FIG. 3A, of areas $S_1$ to $S_4$ between the sides of the rectangular portion 13 of the overlay measuring pattern 11 transferred to a positive photoresist 15 and the edges of the overlay measuring pattern 11, the area $S_2$ of a portion in contact with the right side of the rectangular portion 13 and the area $S_4$ of a portion in contact with the left side may be equal. However, since characters "No. 1" need be written at a portion in contact with the upper side of the rectangular portion 13, the area $S_1$ of the portion in contact with the upper side is larger than the area $S_3$ of a portion in contact with the lower side.

For this reason, even when taper amounts $\Delta x_1$ and $\Delta x_2$ of the photoresist 15 have a relation $\Delta x_1 = \Delta x_2$ in an X-direction section, as shown in FIG. 3B, taper amounts $\Delta y_1$ and $\Delta y_2$ of the photoresist 15 have a relation $\Delta y_1 < \Delta y_2$ in a Y-direction section, as shown in FIG. 3C.

For example, when two overlay measuring patterns 11 are consecutively formed in the X direction, as shown in FIG. 4A, the taper amounts $\Delta y_1$ and $\Delta y_2$ of the photoresist 15 have a relation $\Delta y_1 < \Delta y_2$ in a Y-direction section, as shown in FIG. 4C, and at the same time, the taper amounts $\Delta x_1$ and $\Delta x_2$ of the photoresist 15 also have a relation $\Delta x_1 < \Delta x_2$ in an X-direction, as shown in FIG. 4B.

When the taper amount of the sectional shape of the photoresist 15 on a film 16 to be etched is nonuniform, as shown FIG. 5A, the retreat amount of the etched film 16 increases at the largely tapered portion of the photoresist 15, as shown in FIG. 5B. For this reason, as shown in FIG. 5C, the overlay measuring pattern 11 is transferred to the etched film 16 while the positions of sides of the rectangular portion 13 shift from the original transfer positions.

Consequently, when the next film 17 to be etched is formed on the etched film 16, and the rectangular portion 14 of the overlay measuring pattern 12 is transferred to a photoresist 18 on the film 17 to be etched, as shown in FIG. 6A, a measurement error occurs as if the rectangular portion 14 shifted in both the X and Y directions, although the rectangular portion 14 is accurately formed at the original position, as can be seen from FIG. 6B.

Reportedly, when a 1.2-$\mu$m thick photoresist is heated at 120° C. for 90 sec, the above-described measurement error reaches 0.1 $\mu$m. Hence, erroneous information may be fed back to the next lot, or the photoresist 18 is reformed, resulting a decrease in yield.

SUMMARY OF THE INVENTION

It is an object of the present invention to provide an overlay measuring pattern, a photomask, and an overlay measuring method and apparatus capable of accurately measuring overlay shift between an overlay measuring pattern used for transfer to a lower target transfer film and an overlay measuring pattern used for transfer to an upper target transfer film.

An overlay measuring pattern according to the present invention has band-shaped portions separated from opposite sides of a rectangular portion by an equal distance and parallel to these sides of the rectangular portion. Hence, the areas between sides and band-shaped portions equal each other for portions of an identical length at the opposite sides of the rectangular portion.

For this reason, even when a photoresist is heated after the overlay measuring pattern is transferred to the photoresist, and the photoresist shrinks due to the surface tension of the photoresist, the taper amounts of the sides of the rectangular portion transferred to the photoresist equal each other in their sections between the opposite sides.

Consequently, even when the overlay measuring pattern is transferred to a film to be etched by etching using the photoresist as a mask, and the sides of the rectangular portion transferred to the photoresist shift from those of the rectangular portion transferred to the etched film, the shifts equal each other between the opposite sides of the rectangular portion transferred to the etched film.

That is, even when pattern size shifts are generated between the rectangular portion of the overlay measuring pattern and the rectangular portion transferred to the target transfer film, the pattern size shifts equal each other between the opposite sides of the rectangular portion transferred to the target transfer film.

When a rectangular portion included within or including the rectangular portion transferred to the target transfer film as a lower layer when viewed from above is transferred to a target transfer film as an upper layer, and the distance between a side of the rectangular portion transferred to the target transfer film as the lower layer and a side of the rectangular portion transferred to the target transfer film as the upper layer, which sides oppose each other, is measured, any overlay shift between the overlay measuring pattern used for transfer to the target transfer film as the lower layer and that used for transfer to the target transfer film as the upper layer can be accurately measured.

In a preferred overlay measuring pattern according to the present invention, since the ratio of the length of the band-shaped portion opposing a side of the rectangular portion to the length of the side is 50% or more, the ratio of the length of a portion of the side, which opposes the band-shaped portion, to the length of the side is high. For this reason, even when pattern size shifts are generated between the rectangular portion of the overlay measuring pattern and the rectangular portion transferred to the target transfer film, those portions which have the same pattern size shifts are long between the opposite sides of the rectangular portion transferred to the target transfer film.

Therefore, any overlay shift between the overlay measuring pattern used for transfer to the target transfer film as the lower layer and the overlay measuring pattern used for transfer to the target transfer film as the upper layer can be accurately and easily measured.

A photomask according to the present invention comprises an overlay measuring pattern having a rectangular portion and band-shaped portions separated from opposite sides of the rectangular portion by an equal distance and parallel to these sides. Hence, the areas between sides and band-shaped portions equal each other for portions of an identical length at the opposite sides of the rectangular portion.

For this reason, even when pattern size shifts are generated between the rectangular portion of the overlay measuring pattern in the photomask and the rectangular portion transferred to the target transfer film, the pattern size shifts equal each other between the opposite sides of the rectangular portion transferred to the target transfer film.

When a rectangular portion included within or including the rectangular portion transferred to the target transfer film as a lower layer when viewed from above is transferred to a target transfer film as an upper layer, and the distance between a side of the rectangular portion transferred to the target transfer film as the lower layer and a side of the rectangular portion transferred to the target transfer film as the upper layer, which sides oppose each other, is measured, any overlay shift between the photomask used for transfer to the target transfer film as the lower layer and that used for transfer to the target transfer film as the upper layer can be accurately measured.

In a preferred photomask according to the present invention, since the ratio of the length of the band-shaped portion in the overlay measuring pattern, which opposes a side of the rectangular portion, to the length of the side is 50% or more, the ratio of the length of a portion of the side, which opposes the band-shaped portion, to the length of the side is high.

For this reason, even when pattern size shifts are generated between the rectangular portion of the overlay measuring pattern in the photomask and the rectangular portion transferred to the target transfer film, those portions which have the same pattern size shifts are long between the opposite sides of the rectangular portions transferred to the target transfer film. Therefore, any overlay shift between the photomask used for transfer to the target transfer film as the lower layer and the photomask used for transfer to the target transfer film as the upper layer can be accurately and easily measured.

An overlay measuring method according to the present invention uses first and second patterns each having a rectangular portion and band-shaped portions separated from opposite sides of the rectangular portion by an equal distance and parallel to the sides of the rectangular portion. In both the first and second patterns, the areas between sides and band-shaped portions equal each other for portions of an identical length at the opposite sides of the rectangular portion.

For this reason, even when pattern size shifts are generated between the rectangular portion of the first pattern and the rectangular portion transferred to the target transfer film as the lower layer, and pattern size shifts are generated between the rectangular portion of the second pattern and the rectangular portion transferred to the target transfer film as the upper layer, the pattern size shifts equal each other between the opposite sides of the rectangular portions transferred to the target transfer films as the lower and upper layers.

The rectangular portions of the first and second patterns have sizes with which one includes the other, and the second pattern is transferred to the target transfer film as the upper layer while overlaying the rectangular portion of the second pattern on the rectangular portion transferred to the target transfer film as the lower layer. The distance between a side of the rectangular portion transferred to the target transfer film as the lower layer and a side of the rectangular portion transferred to the target transfer film as the upper layer, which sides oppose each other, corresponds to the overlay shift between the first and second patterns.

When this distance is measured, the overlay shift between the first pattern used for transfer to the target transfer film as the lower layer and the second pattern used for transfer to the target transfer film as the upper layer can be accurately measured on the basis of distances in the same directions.

In a preferred overlay measuring method according to the present invention, in both the first and second patterns, since the ratio of the length of the band-shaped portion in the overlay measuring pattern, which opposes a side of the rectangular portion, to the length of the side is 50% or more, the ratio of the length of a portion of the side, which opposes the band-shaped portion, to the length of the side is high.

For this reason, even when pattern size shifts are generated between the rectangular portion of the first pattern and the rectangular portion transferred to the target transfer film as the lower layer and between the rectangular portion of the second pattern and the rectangular portion transferred to the target transfer film as the upper layer, those portions which have the same pattern size shifts are long between the opposite sides of the rectangular portions transferred to the target transfer films of the lower and upper layers.

As a consequence, any overlay shift between the first and second patterns can be easily obtained from the distance between opposite sides of the rectangular portions transferred to the target transfer films as the lower and upper layers. Therefore, any overlay shift between the first pattern used for transfer to the target transfer film as the lower layer and the second pattern used for transfer to the target transfer film as the upper layer can be accurately and easily measured.

In an overlay measuring apparatus according to the present invention, first and second patterns which overlap each other and each of which has a rectangular portion and band-shaped portions separated from opposite sides of the rectangular portion by an equal distance and parallel to the sides of the rectangular portion, one rectangular portion including the other are scanned to obtain edge signals from the edges of the patterns. To obtain the distance between opposite sides of the first and second patterns, only edge signals corresponding to the sides are used.

For this reason, although band-shaped portions are formed in the first and second patterns, edge signals obtained from these band-shaped portions are neglected, and the distance between opposite sides of the first and second patterns can be obtained. Hence, any overlay shift between the first and second patterns can be accurately measured.

BRIEF DESCRIPTION OF THE DRAWINGS

FIGS. 1A and 1B are views showing a related art of the present invention, in which FIG. 1A is a plan view of an overlay measuring pattern as a main scale and an overlay measuring pattern as a sub scale, and FIG. 1B is a plan view showing a state wherein the overlay measuring pattern as the main scale and the overlay measuring pattern as the sub scale are overlaid;

FIG. 2 is a plan view showing a state wherein four patterns of the related art of the present invention are consecutively formed in the X direction;

FIGS. 3A to 3C are views showing a state wherein one pattern of the related art is formed, in which FIG. 3A is a plan view, FIG. 3B is a longitudinal sectional view taken along a line B—B in FIG. 3A and FIG. 3C is a longitudinal sectional view taken along a line C—C in FIG. 3A;

FIGS. 4A to 4C are views showing a state wherein two patterns of the related art are consecutively formed in the X direction, in which FIG. 4A is a plan view, FIG. 4B is a longitudinal sectional view taken along a line B—B in FIG. 4A and FIG. 4C is a longitudinal sectional view taken along a line C—C in FIG. 4A;

FIGS. 5A to 5C are views showing a state wherein the overlay measuring pattern of the related art is transferred, in which FIG. 5A is a longitudinal sectional view showing a state wherein the overlay measuring pattern is transferred to a photoresist, FIG. 5B is a longitudinal sectional view showing a state wherein the overlay measuring pattern is transferred to an etched film and FIG. 5C is a plan view showing a state wherein the overlay measuring patterns are transferred to the etched film;

FIGS. 6A and 6B are views showing a state wherein the overlay measuring pattern as the main scale and the overlay measuring pattern as the sub scale of the related art are overlaid, in which FIG. 6A is a longitudinal sectional view taken along a line A—A in FIG. 6B, and FIG. 6B is a plan view;

FIGS. 7A and 7B are views showing the first embodiment of the present invention, in which FIG. 7A is a plan view of an overlay measuring pattern as a main scale and an overlay measuring pattern as a sub scale, and FIG. 7B is a plan view showing a state wherein the overlay measuring pattern as the main scale and the overlay measuring pattern as the sub scale are overlaid;

FIGS. 8A to 8C are views showing a state wherein two patterns of the first embodiment are consecutively formed in the X direction, in which FIG. 8A is a plan view, FIG. 8B is a longitudinal sectional view taken along a line B—B in FIG. 8A and FIG. 8C is a longitudinal sectional view taken along a line C—C in FIG. 8A;

DETAILED DESCRIPTION OF THE PREFERRED EMBODIMENTS

Figure 7A:
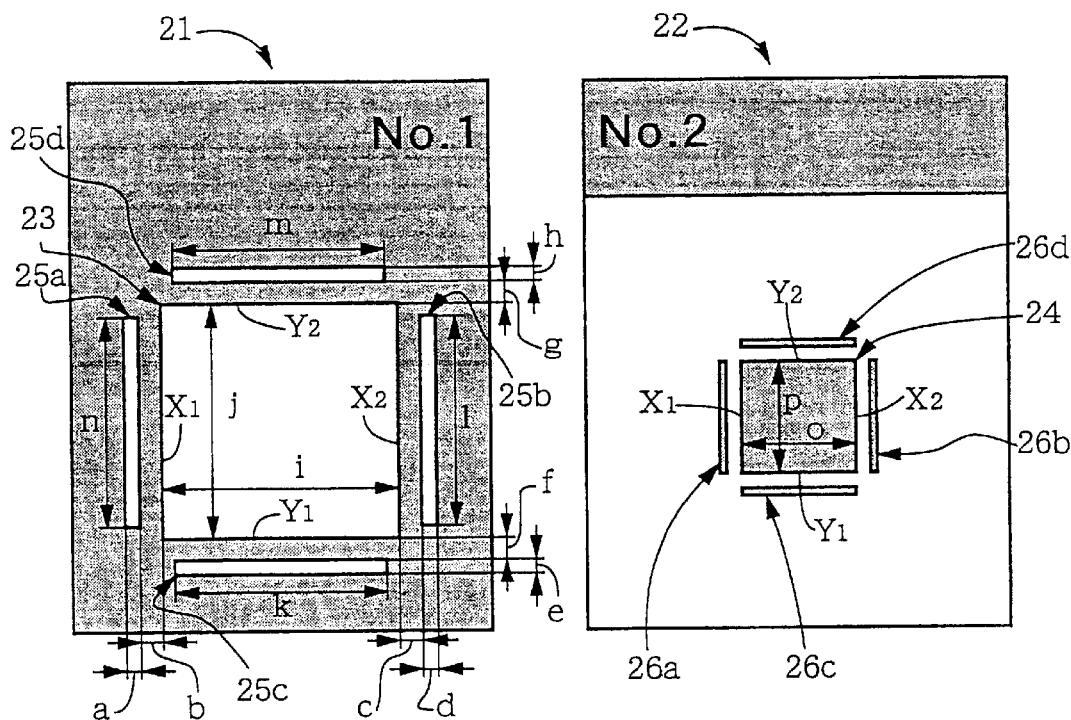

The first to third embodiments of the present invention will be described below with reference to FIGS. 7A to 10. FIGS. 7A to 8C show the first embodiment. As shown in FIG. 7A, the first embodiment comprises an overlay measuring pattern 21 as a main scale and an overlay measuring pattern 22 as a sub scale. The overlay measuring patterns 21 and 22 are formed on photomasks for forming lower and upper patterns, respectively.

The overlay measuring pattern 21 has a rectangular portion 23 as an opening in the pattern formed from chromium or the like. The overlay measuring pattern 22 has a rectangular portion 24 as a pattern formed from chromium or the like. The overlay measuring patterns 21 and 22 have characters such as "No. 1" and "No. 2" to identify the target transfer films on which the patterns are transferred, as shown in FIG. 7A. These characters are also transferred upon transferring the patterns.

The length of lower and upper sides $Y_1$ and $Y_2$ of the rectangular portion 23 is represented by i, and the length of left and right sides $X_1$ and $X_2$ is represented by j. The length of the lower and upper sides $Y_1$ and $Y_2$ of the rectangular portion 24 is represented by o, and the length of the left and right sides $X_1$ and $X_2$ is represented by p. These definitions are substantially the same as in the related art shown in FIGS. 1A and 1B.

In the first embodiment, however, the overlay measuring pattern 21 has band-shaped portions 25a and 25b as openings which are separated from the left and right sides $X_1$ and $X_2$ of the rectangular portion 23 by equal distances b and c and are parallel to the left and right sides $X_1$ and $X_2$, respectively, and band-shaped portions 25c and 25d as openings which are separated from the lower and upper sides $Y_1$ and $Y_2$ by equal distances f and g and are parallel to the lower and upper sides $Y_1$ and $Y_2$, respectively.

Widths a, d, e and h of the band-shaped portions 25a to 25d can be arbitrarily set within the range in which the band-shaped portions can be accommodated in the overlay measuring pattern 21 as far as they have values equal to or larger than the resolution limit of photolithography. However, lengths n and l of the band-shaped portions 25a and 25b are preferably 50% or more of the length j of the left and right sides $X_1$ and $X_2$, respectively, and lengths k and m of the band-shaped portions 25c and 25d are preferably 50% or more of the length i of the lower and upper sides $Y_1$ and $Y_2$, respectively.

In the first embodiment, the overlay measuring pattern 22 also has band-shaped portions 26a to 26d. The relationship between the band-shaped portions 26a to 26d and the rectangular portion 24 is the same as the relationship between the band-shaped portions 25a to 25d and the rectangular portion 23 of the overlay measuring pattern 21.

In the first embodiment, in, e.g., the overlay measuring pattern 21, for portions with the same length at the left and right sides $X_1$ and $X_2$ and portions with the same length at the lower and upper sides $Y_1$ and $Y_2$, the area between the left side $X_1$ and band-shaped portion 25a equals the area between the right side $X_2$ and band-shaped portion 25b while the area between the lower side $Y_1$ and band-shaped portion 25c equals the area between the upper side $Y_2$ and band-shaped portion 25d. These relationships also apply to the overlay measuring pattern 22.

For this reason, even when the photoresist thermally shrinks due to surface tension after it is exposed and developed using the overlay measuring patterns 21 and 22 and then heated for drying and hardening, the taper amounts of the rectangular portions 23 and 24 transferred to the photoresist equal between the left and right sides $X_1$ and $X_2$ and between the lower and upper sides $Y_1$ and $Y_2$ in their sections.

Consequently, when the overlay measuring patterns 21 and 22 are transferred to an etched film by etching using the photoresist as a mask, and the sides $X_1$, $X_2$, $Y_1$ and $Y_2$ of the rectangular portions 23 and 24 transferred to the etched film retreat from the sides $X_1$, $X_2$, $Y_1$ and $Y_2$ of the rectangular portions 23 and 24 transferred to the photoresist, the retreat amounts equal each other between the left and right sides $X_1$ and $X_2$ of the rectangular portions 23 and 24 transferred to the etched film and also between the lower and upper sides $Y_1$ and $Y_2$.

Figure 7B:
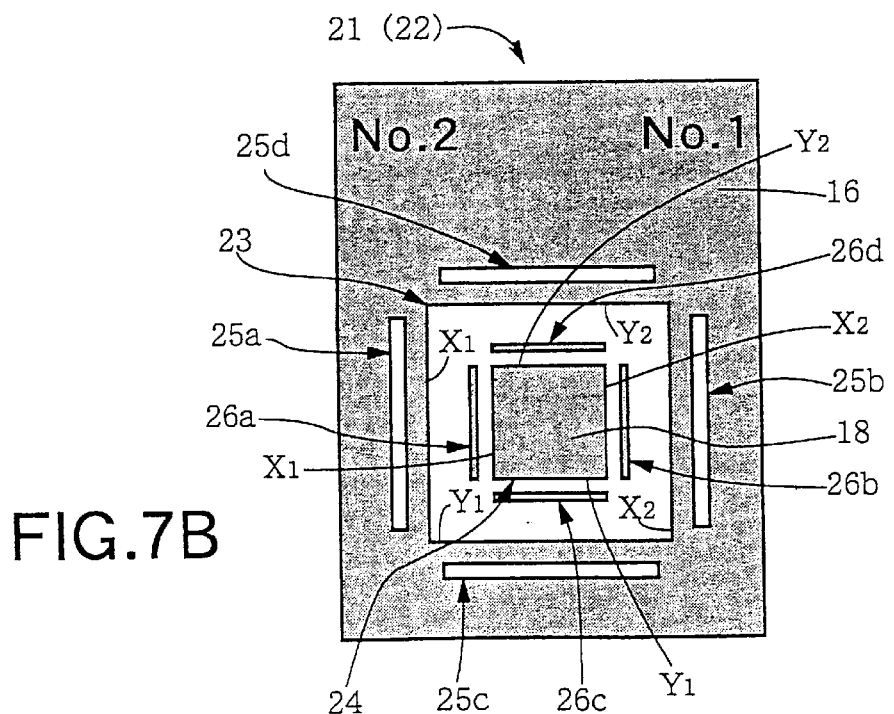

Hence, as shown in FIG. 7B, when the overlay measuring pattern 21 is transferred to an etched film 16 and the overlay measuring pattern 22 is transferred to a photoresist 18, as in FIG. 6A, the difference between a distance $x_1$ from the left side $X_1$ of the rectangular portion 23 to the left side $X_1$ of the rectangular portion 24 and a distance $x_2$ from the right side $x_2$ of the rectangular portion 23 to the right side $X_2$ of the rectangular portion 24, $(x_1-x_2)/2$, accurately represents the overlay shift in the X direction.

Similarly, the difference between a distance $y_1$ from the lower side $Y_1$ of the rectangular portion 23 to the lower side $Y_1$ of the rectangular portion 24 and a distance $y_2$ from the upper side $Y_2$ of the rectangular portion 23 to the upper side $Y_2$ of the rectangular portion 24, $(y_1-y_2)/2$, accurately represents the overlay shift in the Y direction.

Figure 4A:
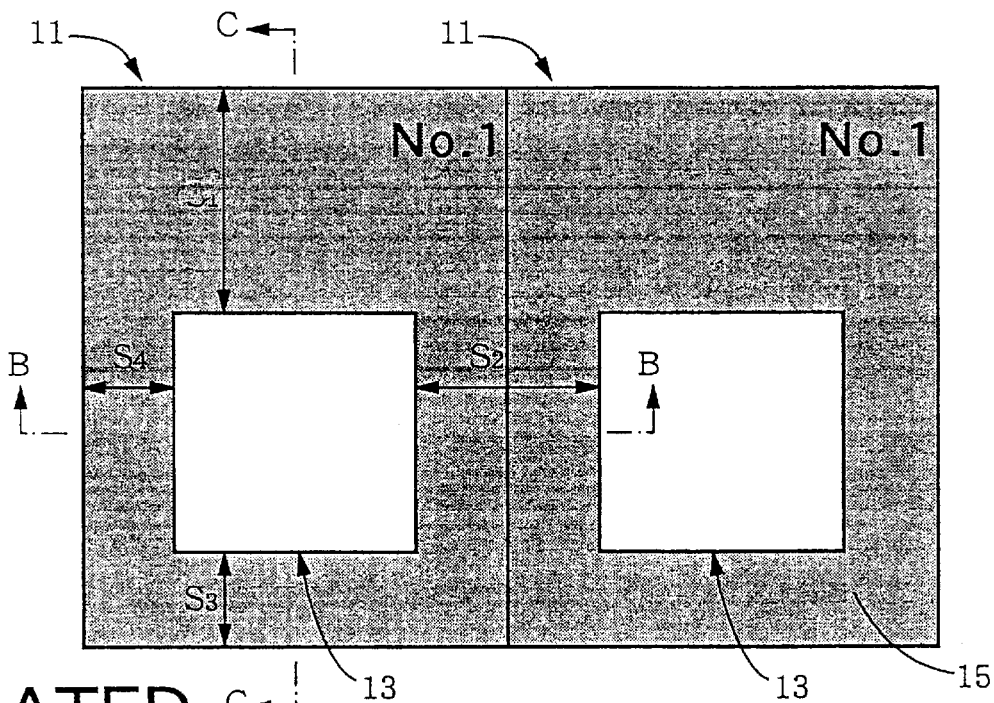
Figure 4B:
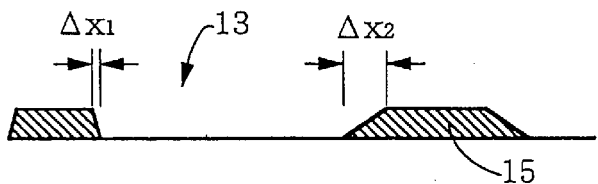
Figure 4C:
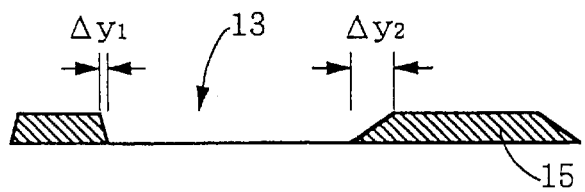
Figure 8A:
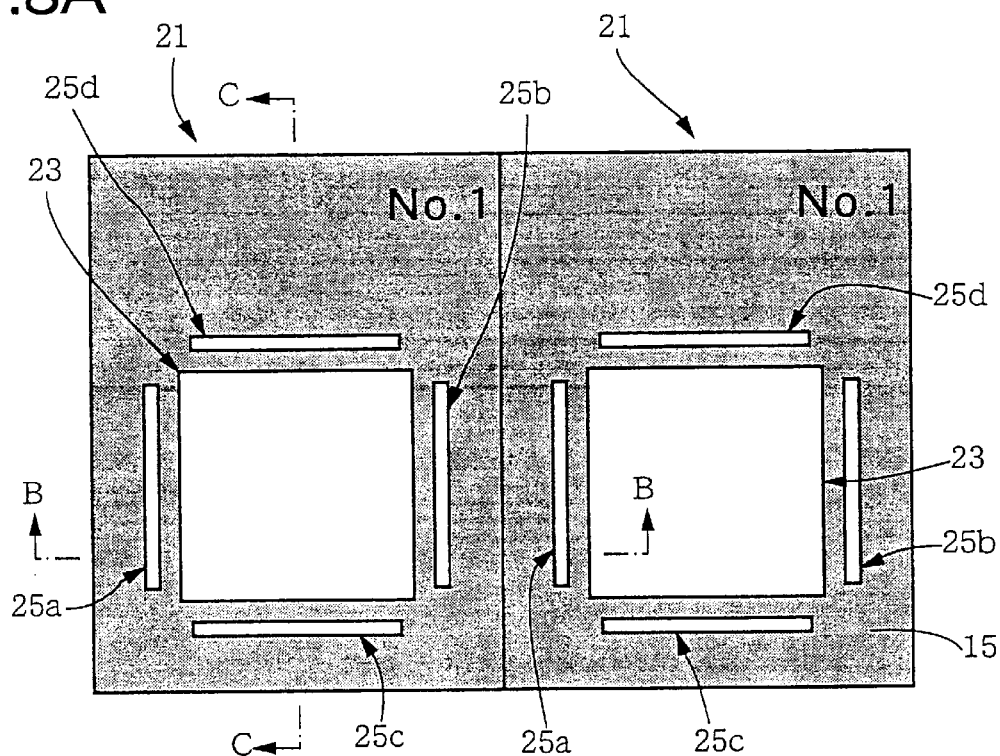
Figure 8B:
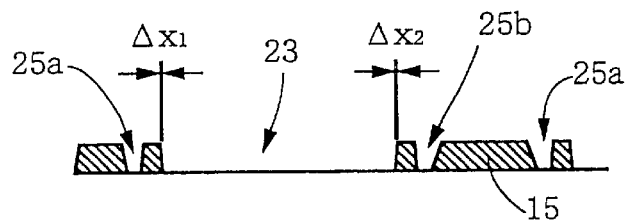
Figure 8C:
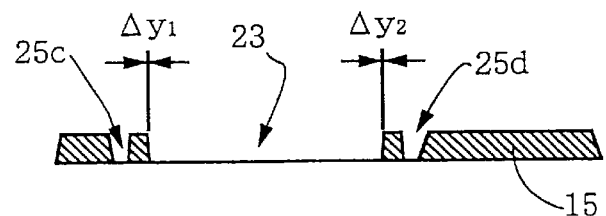

FIGS. 8A to 8C show a state wherein two overlay measuring patterns 21 are consecutively formed on a photoresist 15 in the X direction, as in FIGS. 4A to 4C. In this case as well, taper amounts $\Delta x_1$ and $\Delta x_2$ of the X-direction section of the photoresist 15 have a relation $\Delta x_1 = \Delta x_2$, and taper amounts $\Delta y_1$ and $\Delta y_2$ of the Y-direction section of the photoresist 15 also have a relation $\Delta y_1 = \Delta y_2$, so overlay shifts in the X and Y directions can be accurately obtained.

Figure 1A:
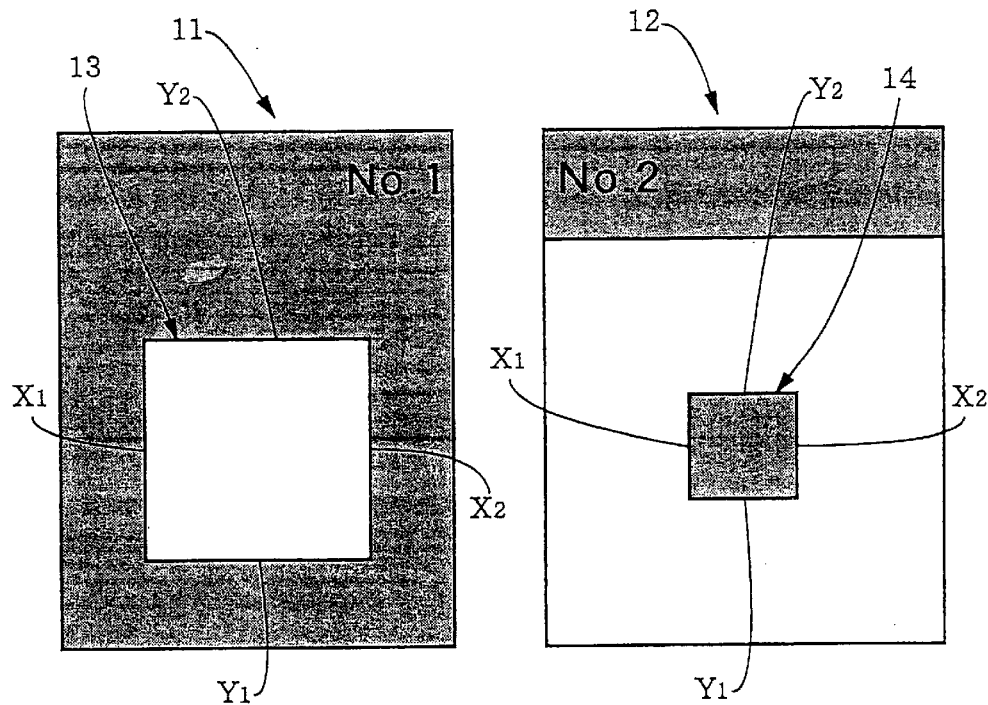
Figure 1B:
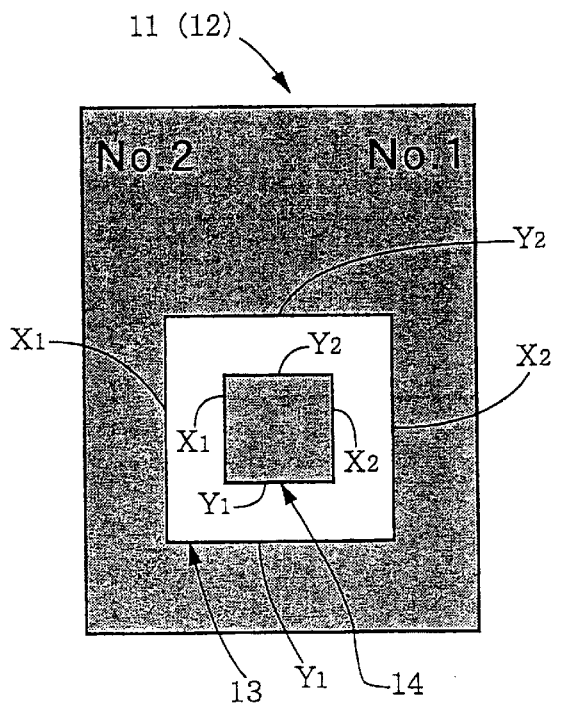

In the related art shown in FIGS. 1A and 1B, as is apparent from FIG. 1B, when the overlay measuring patterns 11 and 12 are scanned in the X direction, edge signals are sequentially generated from the side $X_1$ of the rectangular portion 13, the side $X_1$ of the rectangular portion 14, the side $X_2$ of the rectangular portion 14 and the side $X_2$ of the rectangular portion 13, and the distances $x_1$ and $x_2$ can be easily obtained from these edge signals. The distances $y_1$ and $y_2$ can also be easily obtained.

In the first embodiment, however, as is apparent from FIG. 7B, when the overlay measuring patterns 21 and 22 are scanned in the X direction, edge signals are generated not only from the sides $X_1$ and $X_2$ of the rectangular portions 23 and 24 but also from the band-shaped portions 25a, 25b, 26a and 26b. For this reason, to obtain the distances $x_1$ and $x_2$, the arithmetic section of the overlay measuring apparatus uses only the edge signals generated from the sides $X_1$ and $X_2$ of the rectangular portions 23 and 24 and neglects the edge signals generated from the band-shaped portions 25a, 25b, 26a and 26b.

This also applies to Y direction scanning of the overlay measuring patterns 21 and 22. That is, to obtain the distances $y_1$ and $y_2$, the arithmetic section of the overlay measuring apparatus uses only the edge signals generated from the sides $Y_1$ and $Y_2$ of the rectangular portions 23 and 24 and neglects the edge signals generated from the band-shaped portions 25c, 25d, 26c and 26d.

Figure 9:
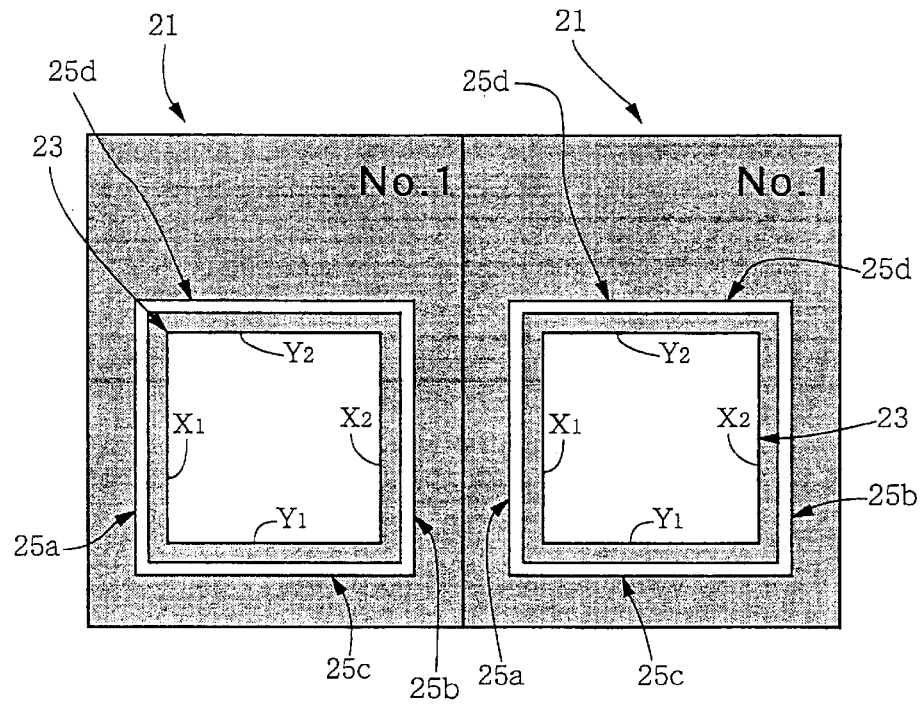
FIG. 9 is a plan view showing a state wherein two patterns of the second embodiment of the present invention are consecutively formed in the X direction.

FIG. 9 shows an overlay measuring pattern 21 as a main scale of the second embodiment. The overlay measuring pattern 21 of the second embodiment substantially has the same arrangement as that of the first embodiment shown in FIGS. 7A to 8C except that band-shaped portions 25a to 25d are connected around a rectangular portion 23 because the band-shaped portions 25a and 25b are longer than left and right sides $X_1$ and $X_2$ and the band-shaped portions 25c and 25d are longer than lower and upper sides $Y_1$ and $Y_2$.

Although not illustrated, an overlay measuring pattern as a sub scale of the second embodiment has the same arrangement as that of the overlay measuring pattern as the main scale. In the second embodiment as well, the same effect as that of the first embodiment can be obtained.

Figure 10:
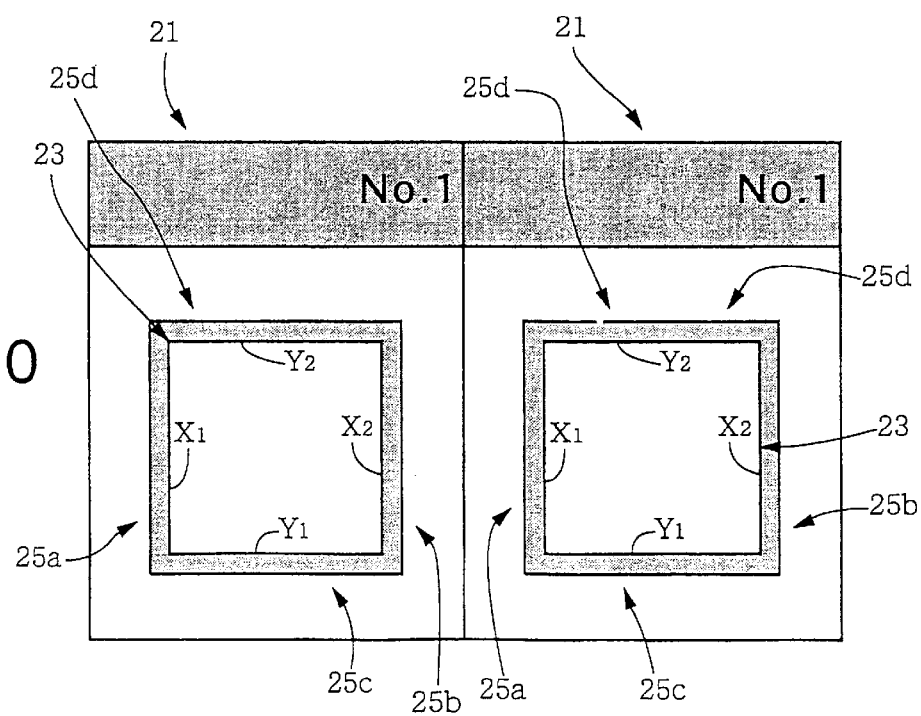
FIG. 10 is a plan view showing a state wherein two patterns of the third embodiment of the present invention are consecutively formed in the X direction.

FIG. 10 shows an overlay measuring pattern 21 as a main scale of the third embodiment. The overlay measuring pattern 21 of the third embodiment substantially has the same arrangement as that of the second embodiment shown in FIG. 9 except that band-shaped portions 25a to 25d become wider to extend to the edges of the overlay measuring pattern 21.

Although not illustrated, an overlay measuring pattern as a sub scale of the third embodiment has the same arrangement as that of the overlay measuring pattern as the main scale. In the third embodiment as well, the same effect as that of the first and second embodiments can be obtained.

What is claimed is:

1. An overlay measuring pattern comprising:

a rectangular portion having a plurality of sides; and a band-shaped portion spaced apart from and surrounding, in a continuous fashion, an outer periphery of said rectangular portion by an equal distance and being parallel to the plurality of sides of said rectangular portion.

2. A photomask comprising an overlay measuring pattern having a rectangular portion including a plurality of sides and a band-shaped portion spaced apart from and surrounding, in a continuous fashion, an outer periphery of said rectangular portion by an equal distance and being parallel to the plurality of sides of said rectangular portion.

* * * * *